United States Patent
Li et al.

(10) Patent No.: US 9,935,384 B1
(45) Date of Patent: Apr. 3, 2018

(54) CIRCUIT BOARD WITH A CONNECTOR HAVING A LATCH THAT INCLUDES A LATCH FRAME, A LATCH SLIDE, AN EJECTOR AND A CONNECTOR ARM

(71) Applicant: Intel Corporation, Santa Clara, CA (US)

(72) Inventors: Xiang Li, Portland, OR (US); George Vergis, Portland, OR (US); John M. Lynch, Forest Grove, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/280,281

(22) Filed: Sep. 29, 2016

(51) Int. Cl.
| | |
|---|---|
| *H01R 13/62* | (2006.01) |
| *H01R 12/70* | (2011.01) |
| *H01R 13/633* | (2006.01) |
| *H01R 12/73* | (2011.01) |
| *H01R 43/20* | (2006.01) |

(52) U.S. Cl.
CPC ....... *H01R 12/7058* (2013.01); *H01R 12/737* (2013.01); *H01R 13/6335* (2013.01); *H01R 43/205* (2013.01)

(58) Field of Classification Search
CPC .......... H01R 13/62933; H01R 23/7005; H01R 13/641; H01R 13/6275
USPC ................. 439/372, 328, 489, 357
See application file for complete search history.

(56) References Cited

U.S. PATENT DOCUMENTS

| | | | |
|---|---|---|---|
| 4,165,909 A * | 8/1979 | Yeager | H01R 12/88 439/260 |
| 4,189,200 A * | 2/1980 | Yeager | H01R 12/88 439/267 |
| 4,487,468 A * | 12/1984 | Fedder | H01R 12/7005 439/325 |
| 4,846,699 A | 7/1989 | Glover et al. | |
| 5,162,979 A | 11/1992 | Anzelone et al. | |
| 5,657,204 A | 8/1997 | Hunt | |
| 5,692,208 A * | 11/1997 | Felcman | G06F 1/1616 312/9.29 |
| 5,740,012 A | 4/1998 | Choi | |
| 5,980,282 A | 11/1999 | Cheng | |
| 6,629,855 B1 | 10/2003 | North et al. | |
| 7,500,863 B2 | 3/2009 | Ringler et al. | |
| 7,798,722 B2 * | 9/2010 | Wulf | F16F 1/3605 267/141.2 |
| 2009/0077293 A1 | 3/2009 | Kerrigan et al. | |

OTHER PUBLICATIONS

Seagate Business Storage User Manual 4-Bay Rackmount NAS, Feb. 17, 2016.
International Search Report and Written Opinion, dated Dec. 11, 2017, issued in related International Application No. PCT/US2017/048953, 14 pages.

* cited by examiner

*Primary Examiner* — Phuong Chi T Nguyen
(74) *Attorney, Agent, or Firm* — Schwabe, Williamson & Wyatt, P.C.

(57) ABSTRACT

A circuit board may include a connector having a circuit module latch that may include a latch frame and pivot-able ejector assembly coupled to the latch frame.

10 Claims, 4 Drawing Sheets

CIRCUIT BOARD WITH A CONNECTOR HAVING A LATCH THAT INCLUDES A LATCH FRAME, A LATCH SLIDE, AN EJECTOR AND A CONNECTOR ARM

TECHNICAL FIELD

The present disclosure relates generally to connecting a circuit module to a circuit board and more particularly to a circuit module latch to connect a circuit module to a circuit board.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Card edge connectors are used in computers and other electronic devices to establish an electrical connection between a main printed circuit board (PCB) and a supplemental PCB. The main PCB may be a motherboard, and the supplemental PCB may be a "daughter card," such as a Dual In-line Memory Module (DIMM) card. A DIMM card may include multiple memory integrated circuits that are coupled together as a memory circuit. DIMM cards are commonly used in the personal computer and other electronics industries.

DIMM socket connectors are a type of card edge connector that is commonly mounted on a motherboard to receive DIMM cards. DIMM socket connectors may include a housing base, which may have a slot with electrical contacts to receive the edge of a DIMM card and to provide electrical connection between the card and the motherboard. A DIMM socket connector may include a rigid lever arm with a latch to secure the card within the connector and an ejector foot to assist in removing the card from the connector. The rigid lever arm may be mounted to pivot at one end of the slot. The ejector foot may extend under the edge of a DIMM card that is inserted into the slot, and the latch may extend partway into a notch in the DIMM card to hold it within the slot. A user may use a finger grip on the rigid lever arm to pivot it so that the ejector foot may raise up against the edge of the DIMM card to eject it from the slot.

DETAILED DESCRIPTION

Figure 1:
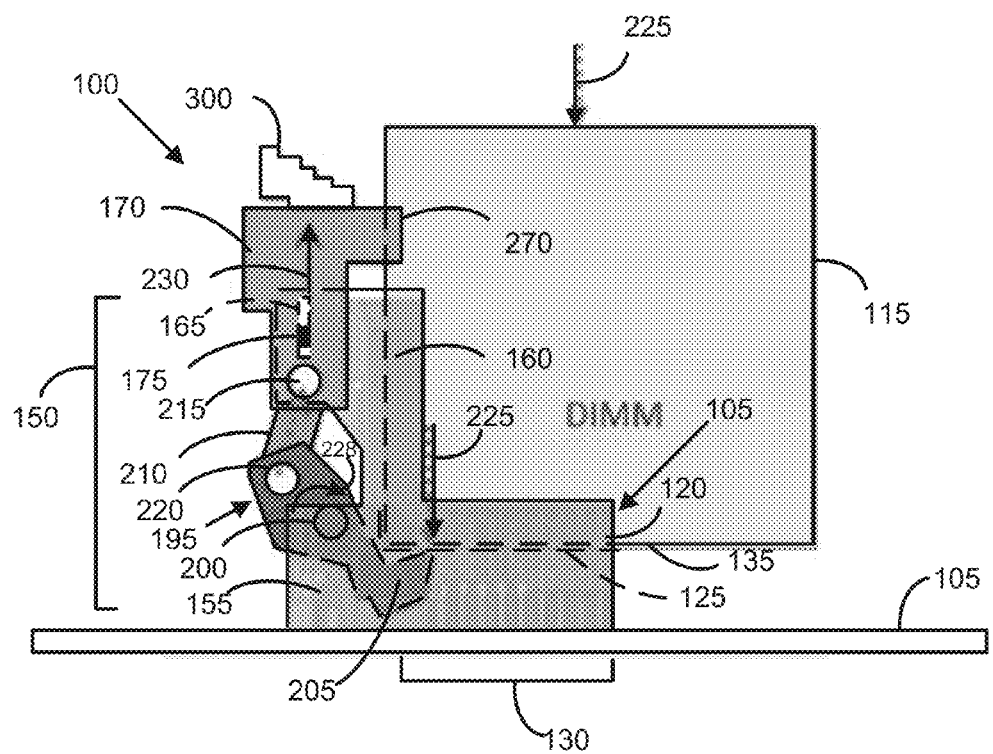
FIGS. 1-3 are side views of an embodiment of a card edge connector latch that may be used with a card edge connector that may be mounted to a main printed circuit board (PCB).

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Figure 2:
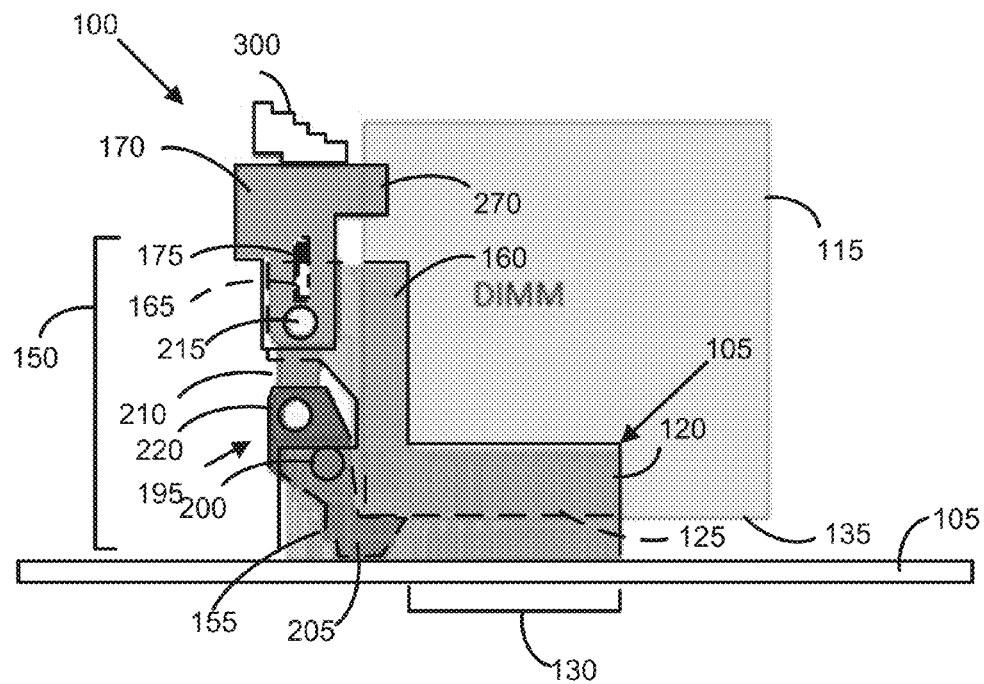
Figure 3:
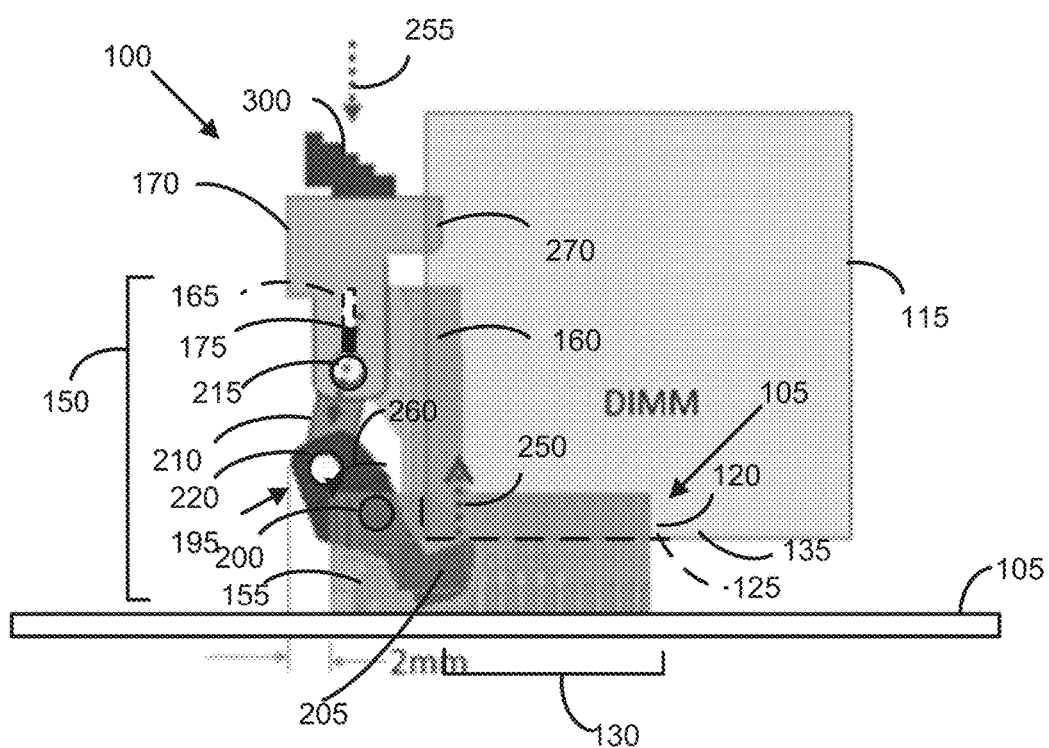

FIGS. 1-3 are side views of an embodiment of a card edge connector latch 100 that may be used with a card edge connector 105 that may be mounted to a main printed circuit board (PCB) 110.

Main PCB 110 may be for use in a computer or another electronic device. Card edge connector 105 may be to receive a supplemental PCB 115, which in embodiments may be referred to as a module or a "daughter card" such as a Dual In-line Memory Module (DIMM) card, to establish an electrical connection between supplemental PCB 115 and main PCB 110. The following description may refer to supplemental PCB 115 as DIMM card 115, but is applicable to supplemental PCBs 115 whether they are DIMM cards or not. DIMM card 115 may include multiple memory integrated circuits that are coupled together as a memory circuit. Card edge connector 105 may include a housing base 120, which may have a card slot 125 (shown in outline) with electrical contacts 130 to receive an edge 135 of DIMM card 115. Edge 135 of DIMM card 115 may include electrical contacts (not shown) that correspond with and engage electrical contacts 130 to provide electrical connection between DIMM card 115 and main PCB 110.

Latch 100 may include a latch frame 150 with a frame base 155 and a frame arm 160 that extends from frame base 155 and includes an elongated guide 165. Elongated guide 165 may be configured as a slot or a track along and/or within frame arm 160 and is shown in dashed lines as being obscured in FIGS. 1-3. A latch slider 170 may be connected to frame arm 160 for movement along elongated guide 165 and may include a pin or stem 175 that fits and moves within guide 165. A rigid ejector 195 may be pivotally coupled to the frame base 155 at a pivot 200. Latch 100 may also include ejector 195. Ejector 195 may include an ejector foot 205 that may extend under and engage edge 135 of DIMM card 115. Further, a connector arm 210 may be pivotally coupled to the latch slider 170 at a pivot 215 and to the ejector 195 at a pivot 220 that is opposite pivot 200 from ejector foot 205. Connector arm 210 may couple pivotal movement of ejector 195 and movement of latch slider 170 along elongated guide 165 as a rocker-slider linkage.

FIG. 1 illustrates card edge connector latch 100 in which DIMM card 115 may be inserted into card slot 125 in a direction 225. In embodiments, a user or an assembler may insert DIMM card 115 into card slot 125, which may push ejector foot 205 in direction 225. Movement of ejector foot 205 in direction 225 by insertion of DIMM card 115 into card slot 125 may operate the slider-rocker linkage of latch 100 in an insertion direction. Movement of ejector foot 205 in direction 225 may cause ejector 195 to pivot about pivot 200 in a rotational direction 228 (e.g., clock-wise, as illustrated in FIG. 1) corresponding to movement of ejector foot 205 in direction 225. As a result, latch slider 170 may move along guide 165 in a direction 230 opposite direction 225, and frame arm 160 engages DIMM card 115 to secure DIMM card 115 in place. In embodiments, directions 225 and 230 may be generally perpendicular to main PCB 110.

FIG. 2 illustrates card edge connector latch 100 with DIMM card 115 may be fully inserted into card slot 125. As a result, ejector foot 205 may be positioned at its maximum insertion position 240 toward main PCB 110 under edge 135 of DIMM card 115, and correspondingly, latch slider 170 may be at its maximum position, as may be indicated by position of pin 175 in elongated guide 165. When the latch slider 170 is at its maximum position, the circuit module guide 270 may engage the DIMM card 115 and secure DIMM card 115 in place.

FIG. 3 illustrates card edge connector latch 100 with DIMM card 115 may be ejected from card slot 125 in a direction 250. In embodiments, a user or an assembler may eject DIMM card 115 from card slot 125 by pressing or moving latch slider 170 in direction 255 toward main PCB 110, opposite direction 250, which may operate the slider-rocker linkage of latch 100 in an ejection direction. In embodiments, directions 250 and 255 may be generally perpendicular to main PCB 110. Movement of latch slider 170 in direction 255 along elongated guide 165 may cause ejector 195 to pivot about pivot 200 in a rotational direction 260 (e.g., counter-clock-wise, as illustrated in FIG. 3) corresponding to movement of ejector foot 205 in direction 250. As a result, ejector foot 205 may eject DIMM card 115 from card slot 125. In embodiments, the operation of the slider-rocker linkage of latch 100 may encompass an overage space 275 of about 2 mm into which ejector 195 may move during ejection (see e.g., FIG. 4).

Figure 4:
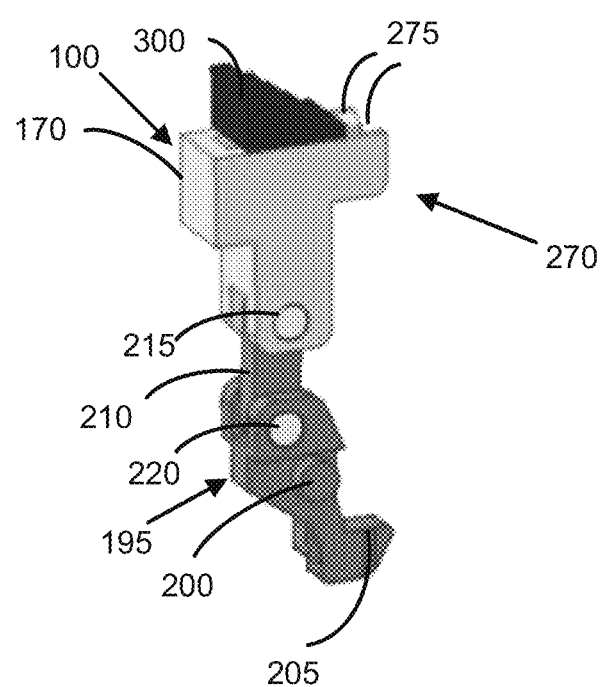
FIG. 4 is an isometric view of an embodiment of a card edge connector latch.
Figure 5:
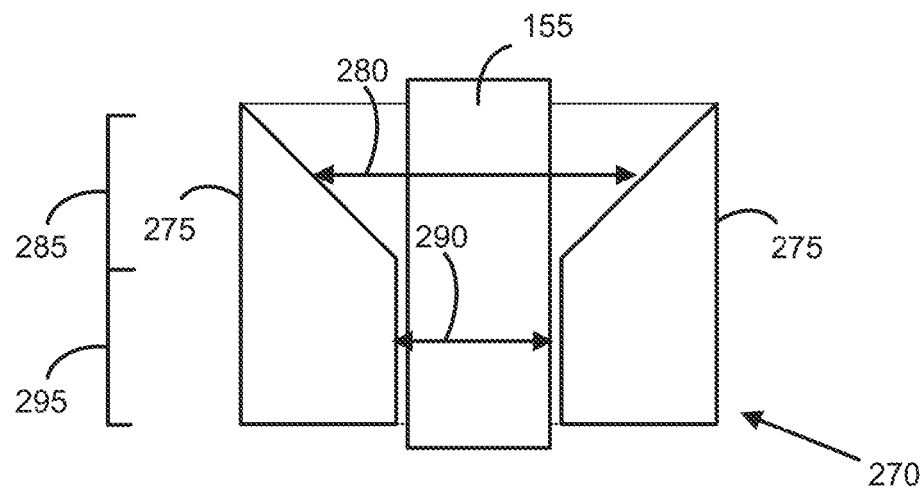
FIG. 5 is an enlarged end view illustrating an embodiment of circuit module guide that may be included in embodiments of a card edge connector latch.

FIG. 4 is an isometric view of an embodiment of latch 100 and illustrates latch slider 170, rigid ejector 195 with ejector foot 205, and connector arm 210 pivotally coupled to latch slider 170 at pivot 215 and to the ejector 195 at pivot 220. In addition, FIG. 4 illustrates that latch slider 170 may include a circuit module guide 270 that may provide an aligned position of a circuit module, such as a DIMM card 155, to be inserted into card slot 125. FIG. 5 is an enlarged end view illustrating an embodiment of circuit module guide 270.

In embodiments, circuit module guide 270 may include a spaced-apart pair of guide tabs 275 that may extend from latch slider 170. A side edge of DIMM card 115, for example, may fit between guide tabs 275 as DIMM card 115 is moved toward, for insertion into, card slot 125. Circuit module guide 270 may facilitate alignment of DIMM card 115 with card slot 125. As illustrated in FIG. 5, guide tabs 275 may have decreasing spacing 280. In embodiments, guide tabs 275 may have decreasing spacing 280 between them for a first extent 285, and may have fixed spacing 290 between them for a subsequent second extent 295. The decreasing spacing 280 in the first extent 285 may facilitate inserting of the side edge of DIMM card 115 between guide tabs 275, and the fixed spacing 290 for the second extent 295 may facilitate alignment of the DIMM card 115 with card slot 125.

Figure 6:
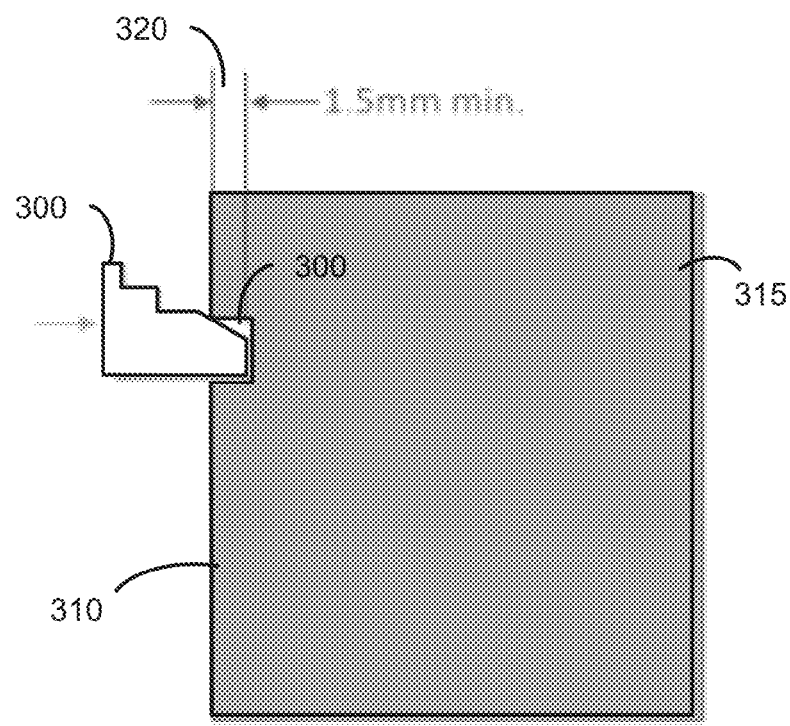
FIG. 6 illustrates a side view of an embodiment of a lock engaging a notch in a side edge of a circuit module or card.

FIG. 4 also illustrates that latch slider 170 may include a lock 300, which may be operably coupled to latch slider 170 and may be positioned with circuit module guide 270 to engage and lock a circuit module or card in place within card slot 125. FIG. 6 illustrates a side view of an embodiment of lock 300 engaging a notch 305 in a side edge 310 of a circuit module or card 315 (e.g., DIMM card) to secure it in place within card slot 125. In embodiments, lock 300 may be under spring bias to engage notch 305 and to lock circuit module or card 315 in place within card slot 125. A user may release look 300 by sliding it back away from notch 305, against the spring bias, when ejecting circuit module or card 315 from card slot 125.

An aspect of latch 100 is that it may provide or enable one or more improvements for an electronic or computer system, in which the improvements may include increased space for circuit devices on main PCB 110, improved thermal cooling or performance of devices or cards held in card edge connector 105, and/or increased space for circuitry (e.g., memory such as DRAM) on devices or cards held in card edge connector 105.

In some electronic or computer systems, spacing for electronic and circuit components is very limited, which can reduce the amounts of circuitry that can fit in a space and can increase problems with dissipating heat generated by the circuitry. For example, some server platforms, as well as other computers, may include large numbers of DIMM cards that may be positioned as closely together as possible to fit within a limited space. Cooling of such systems may include an air flow that is directed across the DIMM cards, such as from the side where a connector latch may be positioned for the card socket. Some legacy DIMM socket connectors, such as a legacy DDR4 RDIMM connector that includes a single rigid lever arm, may be create issues with regard to spacing for circuit devices on a main PCB, thermal cooling or performance of devices or cards held in a card edge connector, and spacing for circuitry (e.g., memory such as DRAM) on devices or cards held in the card edge connector.

For example, embodiments of a legacy DDR4 RDIMM connector may require a 10 mm keepout zone that is reserved for pivoting of the rigid lever arm during insertion and ejection of DIMM cards from card sockets. The 10 mm keepout zone may be a region that extends 10 mm from the DDR4 RDIMM connector, and be the width of the rigid lever arm, in which electronic circuitry may not be not placed because of operation of the rigid lever arm. Over the large numbers of DIMM cards that may be included in a large number of server platforms, for example, such keepout zones may represent a significant loss of potential space for electronic circuitry. In contrast, embodiments of connector latch 100 described herein employ a linear movement of latch slider 170 along guide 165, which may be generally perpendicular to main PCB 110 and may significantly reduce the keepout zones required by the pivoting rigid lever arms of legacy connectors.

In addition, the rigid lever arms of legacy DDR4 RDIMM connectors may have widths that may interfere with the flow of cooling air that may be directed across the DIMM cards, such as from the side where a connector latch may be positioned for the card socket. For example, embodiments of the rigid lever arms of legacy DDR4 RDIMM connectors may have widths of about 6.5 mm. In contrast, embodiments of connector latch 100 may have a width of 3.5 mm, which can significantly increase the flow of cooling air across DIMM cards, for example, and thereby improve thermal performance of the system.

In embodiments, lock 300 may be under spring bias to engage notch 305 and to lock circuit module or card 315 (e.g., DIMM card) in place within card slot 125. As illustrated in FIG. 6, embodiments in which lock 300 may engage of notch 305 under spring bias may provide securement of circuit module or card 315 with notch 305 having a depth 320 of 1.5 mm. In contrast, the notch in the edge of a DIMM card for a legacy DDR4 RDIMM connectors may have a minimum depth of 2.5 mm to account for the pivot motion of the rigid lever arm and the absence of a spring bias to provide adequate engagement. As a result, lock 300 under spring bias may decrease the area required for card lock notches and may, therefore, provide for increased space for electronic circuitry on such cards.

Thus various example embodiments of the present disclosure have been described including, but are not limited to:

Example 1 may include a circuit board, which may comprise a connector having a latch that may include:

a latch frame with a frame base and a frame arm that extends from the frame base and includes an elongated guide; a latch slider connected to the frame arm for movement along the elongated guide; an ejector pivotally coupled to the frame base; and a connector arm pivotally coupled to the latch slider and the ejector to couple pivotal movement of the ejector and movement of the latch slider along the elongated guide.

Example 2 may include the circuit board of example 1 wherein the connector arm may be pivotally coupled to the ejector at an ejector-connector arm coupling, the ejector may further include an ejector foot to engage a circuit module, and the ejector may be pivotally coupled to the frame base at an ejector pivot positioned between the ejector-connector arm coupling and the ejector foot.

Example 3 may include the circuit board of example 1 wherein the latch slider may include a circuit module guide to provide an aligned position of a circuit module to be mated with the connector.

Example 4 may include the circuit board of example 3 wherein the circuit module guide may include a spaced-apart pair of guide tabs between which an edge of a circuit module fits for the aligned position.

Example 5 may include the circuit board of example 4 wherein the pair of guide tabs may have decreasing spacing between them in a direction toward the frame base.

Example 6 may include the circuit board of example 3 wherein the circuit module latch may further include a lock operably coupled to the latch slider and positioned with the circuit module guide to engage and lock a circuit module in place.

Example 7 may include the circuit board of example 1 wherein the circuit module latch may further include a lock to engage and lock a circuit module in place.

Example 8 may include the circuit board of example 7 wherein the lock may be operably coupled to the latch slider.

Example 9 may include the circuit board of example 8 wherein the lock may be under bias to lock a circuit module to be mated with the connector.

Example 10 may include the circuit board of example 1 wherein the elongated guide may include a slot in the frame arm and the latch slider may include a pin that extends into and moves along the slot.

Example 11 may include the circuit board of example 1 wherein the connector may be to receive a DIMM memory module.

Example 12 may include the circuit board of example 1 wherein the latch frame may be secured in a fixed position relative to the connector.

Example 13 may include a computer system, which may comprise a circuit board with plural integrated circuits and a connector to provide connection between a circuit module and the plural integrated circuits of the circuit board, wherein the connector may have a circuit module latch that may include:

a latch frame positioned proximal to a circuit module socket; and rocker-slider ejector means coupled to the latch frame to eject a circuit module from the circuit module socket.

Example 14 may include the computer system of example 13 wherein opposed first and second directions correspond to respective directions a circuit module is inserted into and removed from the circuit module socket and the rocker-slider ejector means may be activated in the first direction to eject a circuit module from the circuit module socket.

Example 15 may include the computer system of example 14 wherein the circuit module latch may further include lock means operable in at least one direction transverse to the first and second directions to lock a circuit module in the circuit module socket.

Example 16 may include the computer system of example 13 wherein the circuit module latch may further include circuit module guide means to align a circuit module for insertion into the circuit module socket.

Example 17 may include the computer system of example 16 wherein the circuit module latch may further include lock means operable in alignment with the circuit module guide means to lock a circuit module in the circuit module socket.

Example 18 may include the computer system of example 13 wherein the connector may be to receive a DIMM memory module.

Example 19 may include a method, which may comprise:

securing a circuit module socket to a circuit board; and securing a circuit module latch to the circuit board adjacent to the circuit module socket, the circuit module latch may include a latch frame positioned proximal to a circuit module socket and a rocker-slider ejector coupled to the latch frame and operable to eject a circuit module from the circuit module socket.

Example 20 may include the method of example 19 and may further include inserting a circuit module into the circuit module socket and in engagement with the circuit module latch.

Example 21 may include the method of example 20 wherein the circuit module latch may further include a circuit module guide to align a circuit module for insertion into the circuit module socket and inserting the circuit module into the circuit module socket may include engaging an edge of the circuit module with the circuit module guide.

Example 22 may include the method of example 20 wherein the circuit module latch may further include a circuit module lock to lock in place a circuit module in the circuit module socket and the method may further include engaging the circuit module lock with the circuit module upon inserting the circuit module into the circuit module socket.

Example 23 may include a circuit board, which may comprise a connector having a latch that may include:

a latch frame with a frame base and a frame arm that extends from the frame base and includes an elongated guide;

a latch slider connected to the frame arm for movement along the elongated guide;

an ejector pivotally coupled to the frame base; and a connector arm pivotally coupled to the latch slider and the ejector to couple pivotal movement of the ejector and movement of the latch slider along the elongated guide.

Example 24 may include the circuit board of example 23 wherein the connector arm may be pivotally coupled to the ejector at an ejector-connector arm coupling, the ejector may further include an ejector foot to engage a circuit module, and the ejector may be pivotally coupled to the frame base at an ejector pivot positioned between the ejector-connector arm coupling and the ejector foot.

Example 25 may include the circuit board of examples 23 or 24 wherein the latch slider may include a circuit module guide to provide an aligned position of a circuit module to be mated with the connector.

Example 26 may include the circuit board of example 25 wherein the circuit module guide may include a spaced-apart pair of guide tabs between which an edge of a circuit module fits for the aligned position.

Example 27 may include the circuit board of example 26 wherein the pair of guide tabs may have decreasing spacing between them in a direction toward the frame base.

Example 28 may include the circuit board of example 25 wherein the circuit module latch may further include a lock operably coupled to the latch slider and positioned with the circuit module guide to engage and lock a circuit module in place.

Example 29 may include the circuit board of examples 23 or 24 wherein the circuit module latch may further include a lock to engage and lock a circuit module in place.

Example 30 may include the circuit board of example 29 wherein the lock may be operably coupled to the latch slider.

Example 31 may include the circuit board of example 30 wherein the lock may be under bias to lock a circuit module to be mated with the connector.

Example 32 may include the circuit board of examples 23 or 24 wherein the elongated guide may include a slot in the frame arm and the latch slider may include a pin that extends into and moves along the slot.

Example 33 may include the circuit board of examples 23 or 24 wherein the connector may be to receive a DIMM memory module.

Example 34 may include the circuit board of examples 23 or 24 wherein the latch frame may be secured in a fixed position relative to the connector.

Example 35 may include a computer system, which may comprise a circuit board with plural integrated circuits and a connector to provide connection between a circuit module and the plural integrated circuits of the circuit board, wherein the connector may have a circuit module latch that may include:

a latch frame positioned proximal to a circuit module socket; and rocker-slider ejector means coupled to the latch frame to eject a circuit module from the circuit module socket.

Example 36 may include the computer system of example 35 wherein opposed first and second directions correspond to respective directions a circuit module is inserted into and removed from the circuit module socket and the rocker-slider ejector means may be activated in the first direction to eject a circuit module from the circuit module socket.

Example 37 may include the computer system of example 36 wherein the circuit module latch may further include lock means operable in at least one direction transverse to the first and second directions to lock a circuit module in the circuit module socket.

Example 38 may include the computer system of any of examples 35-37 wherein the circuit module latch may further include circuit module guide means to align a circuit module for insertion into the circuit module socket.

Example 39 may include the computer system of example 38 wherein the circuit module latch may further include lock means operable in alignment with the circuit module guide means to lock a circuit module in the circuit module socket.

Example 40 may include the computer system of any of examples 35-37 wherein the connector may be to receive a DIMM memory module.

Example 41 may include a method, which may comprise:

securing a circuit module socket to a circuit board; and securing a circuit module latch to the circuit board adjacent to the circuit module socket, the circuit module latch may include a latch frame positioned proximal to a circuit module socket and a rocker-slider ejector coupled to the latch frame and operable to eject a circuit module from the circuit module socket.

Example 42 may include the method of example 41 and may further include inserting a circuit module into the circuit module socket and in engagement with the circuit module latch.

Example 43 may include the method of example 42 wherein the circuit module latch may further include a circuit module guide to align a circuit module for insertion into the circuit module socket and inserting the circuit module into the circuit module socket may include engaging an edge of the circuit module with the circuit module guide.

Example 44 may include the method of examples 42 or 43 wherein the circuit module latch may further include a circuit module lock to lock in place a circuit module in the circuit module socket and the method may further include engaging the circuit module lock with the circuit module upon inserting the circuit module into the circuit module socket.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. A circuit board, comprising:
   a connector having a latch that includes:
   a latch frame with a frame base and a frame arm that extends from the frame base and includes an elongated guide;
   a latch slider connected to the frame arm for movement along the elongated guide;
   an ejector pivotally coupled to the frame base; and a connector arm pivotally coupled to the latch slider and the ejector to couple pivotal movement of the ejector and movement of the latch slider along the elongated guide;

wherein the latch slider includes a circuit module guide to provide an aligned position of a circuit module to be mated with the connector, and the circuit module guide includes a spaced-apart pair of guide tabs between which an edge of a circuit module fits for the aligned position.

2. The circuit board of claim 1 wherein the connector arm is pivotally coupled to the ejector, the ejector further includes an ejector foot to engage a circuit module, and the ejector is pivotally coupled to the frame base at an ejector pivot positioned between the ejector-connector arm coupling and the ejector foot.

3. The circuit board of claim 1, wherein the pair of guide tabs have decreasing spacing between them in a direction toward the frame base.

4. The circuit board of claim 1, wherein the latch further includes a lock operably coupled to the latch slider and positioned with the circuit module guide to engage and lock a circuit module in place.

5. A circuit board, comprising:
a connector having a latch that includes:
a latch frame with a frame base and a frame arm that extends from the frame base and includes an elongated guide;
a latch slider connected to the frame arm for movement along the elongated guide;
an ejector pivotally coupled to the frame base; and
a connector arm pivotally coupled to the latch slider and the ejector to couple pivotal movement of the ejector and movement of the latch slider along the elongated guide;
wherein the latch further includes a lock to engage and lock a circuit module in place.

6. The circuit board of claim 5, wherein the elongated guide includes a slot in the frame arm and the latch slider includes a pin that extends into and moves along the slot.

7. The circuit board of claim 5, wherein the connector is to receive a dual in-line memory module.

8. The circuit board of claim 5, wherein the latch frame is secured in a fixed position relative to the connector.

9. The circuit board of claim 5 wherein the lock is operably coupled to the latch slider.

10. The circuit board of claim 9 wherein the lock is under bias to lock a circuit module to be mated with the connector.

* * * * *